(12) United States Patent
Kamada et al.

(10) Patent No.: US 7,584,393 B2
(45) Date of Patent: Sep. 1, 2009

(54) SCAN TEST CIRCUIT AND METHOD OF ARRANGING THE SAME

(75) Inventors: Tetsuo Kamada, Kanagawa-ken (JP); Toru Sasaki, Kanagawa-ken (JP); Hiroshi Shimizu, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 467 days.

(21) Appl. No.: 11/421,885

(22) Filed: Jun. 2, 2006

(65) Prior Publication Data

US 2007/0011524 A1    Jan. 11, 2007

(30) Foreign Application Priority Data

Jun. 7, 2005    (JP) ............................. 2005-167278

(51) Int. Cl.
*G01R 31/3183*    (2006.01)
*G01R 31/40*    (2006.01)

(52) U.S. Cl. ..................... 714/726; 714/729; 714/744

(58) Field of Classification Search ....................... None
See application file for complete search history.

(56) References Cited

U.S. PATENT DOCUMENTS 5,850,150 A * 12/1998 Mitra et al. .................... 326/16
2005/0240846 A1* 10/2005 Madpuwar et al. .......... 714/726

FOREIGN PATENT DOCUMENTS

JP    09203767 A  *  8/1997
JP    2002-329784    11/2002

* cited by examiner

*Primary Examiner*—Cynthia Britt
*Assistant Examiner*—Dipakkumar Gandhi
(74) *Attorney, Agent, or Firm*—Oblon, Spivak, McClelland, Maier & Neustadt, P.C.

(57) ABSTRACT

Replaced cell CELL1 is composed of clock buffer circuit CB1 and flip-flop circuit FF1 that latches data at a falling-down time of a clock signal. Clock buffer circuits CB1a-CB1d are cascade-connected to form a clock tree circuit. A scan circuit is composed of scan flip-flop circuits SFF1-SFF4. Replaced cell CELL1 is set in place of the last stage neighboring a scan circuit side between the scan circuit and the clock buffer circuits CB1a-CB1d to easily optimize timing adjustments and layout design.

14 Claims, 5 Drawing Sheets

SCAN TEST CIRCUIT AND METHOD OF ARRANGING THE SAME

CROSS-REFERENCE OF RELATED APPLICATIONS

This application is based upon and claims the benefit of priority from the prior Japanese Patent Application No. 2005-167278, filed on Jun. 7, 2005, the entire contents of which are incorporated herein by reference.

FIELD OF THE INVENTION

This invention generally relates to feasible function-test design for a semiconductor integrated circuit and, in particular, to scan-test circuit applied to a scan-test method and a method of arranging the same.

BACKGROUND OF THE INVENTION

Since a system LSI device has a lot of system function devices formed on a same single chip and an SoC (system-on-chip) device has memories, logic circuits and analog circuits integrated in a chip, such a system LSI device and an SoC device have been used in mobile intelligence apparatus and personal computers as information handling equipment, etc. have been recently developed to have high-degree performances and versatile functions. For large scale and high-speed system LSI devices and SoC devices, a technology called the design for testability (DFT), such as a scan-test method and a built-in self-test (BIST) method, is used to prevent test costs, etc. from increasing. In the scan-test method, flip-flop circuits are substituted for scan flip-flop circuits. When the scan flip-flop circuits are used, their values can be set from the outside and such values can be read out from outer input-output terminals of the scan flip-flop circuits. As a result, test patterns can be made easily by means of an automatic test pattern generator (ATPG) as disclosed in Japanese Patent Publication 2002-329784, for instance (see particularly descriptions on page 5 and FIG. 2).

A scan-test circuit used in the scan-test method receives a scan-shift enable signal as a scan control signal. When the scan-shift enable signal is supplied through pipe-lined architecture, additional flip-flop circuits are inserted in the circuits to distribute scan enable signals to loads and to synchronize the same with each other. Such arrangements are so troublesome for timing adjustments and layout design that the arrangements take unexpected time for design and are difficult for optimization.

The present invention provides a scan test circuit with easy optimization for timing adjustments and layout design and a method of arranging the same.

SUMMARY OF THE INVENTION

One aspect of the present invention is directed to a scan test circuit including a clock control circuit, a clock buffer circuit section, a replaced cell and a scan circuit. The clock buffer circuit section has clock buffer circuits cascade-connected to drive a clock signal supplied from the clock control circuit and forms a clock tree circuit. The replaced cell is connected to the clock buffer circuit section and is set in place of a stage of the clock buffer circuits of the buffer circuit section. The replaced cell receives a scan shift enable signal supplied from the scan control circuit and a clock signal supplied from the clock circuits, and outputs the clock signal and the scan shift enable signal synchronized with the clock signal. The scan circuit receives the scan shift enable signal synchronized with the clock signal output from the replaced cell, the clock signal and a scan input signal, and outputs signals for scan tests.

Another aspect of the present invention is directed to a method of arranging a scan test circuit which connects among a clock control circuit, a scan control circuit, a clock buffer circuit section, a replaced cell and a scan circuit. The clock buffer circuit section has clock buffer circuits cascade-connected in the form of a clock tree circuit to drive a clock signal supplied from the clock control circuit. The replaced cell is connected to the clock buffer circuit section and is set in place of a stage of the clock tree circuit of the clock buffer circuits in the buffer section. The replaced cell receives a scan shift enable signal supplied from the scan control circuit, and a clock signal supplied from the clock buffer circuit section and provides the scan circuit with the scan shift enable signal synchronized with the clock signal. The scan circuit outputs signals for scan tests.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DETAILED DESCRIPTION OF THE INVENTION

Figure 1:
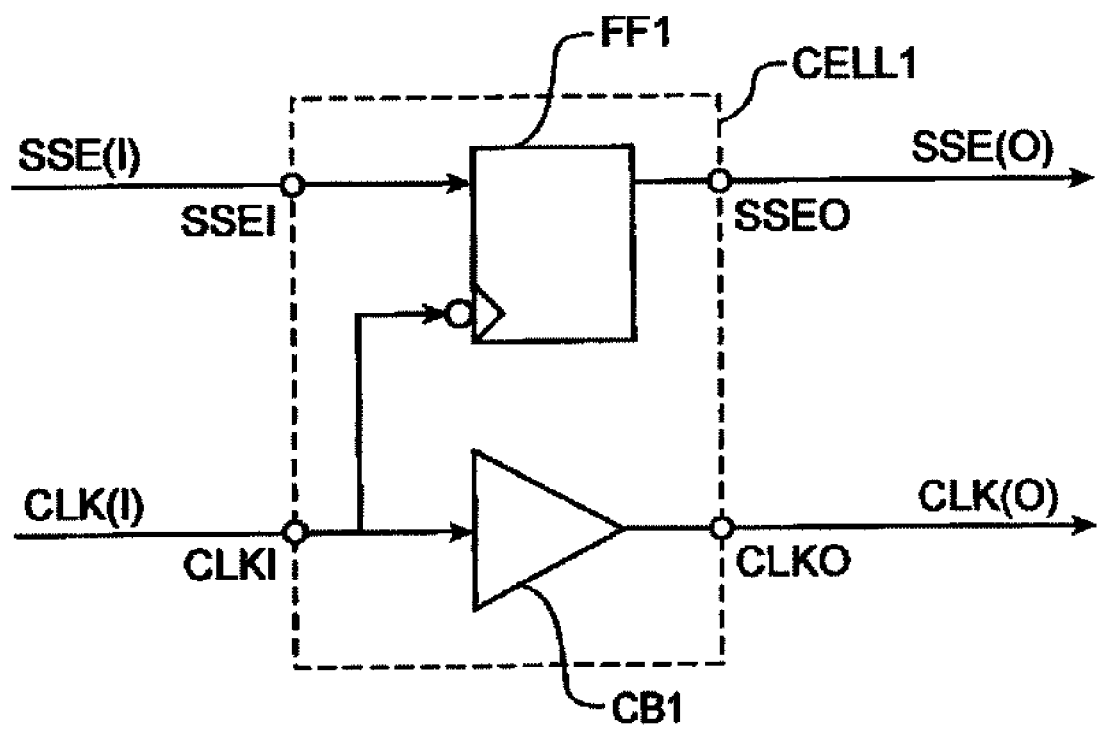
FIG. 1 is a block diagram of a replaced cell in accordance with a first embodiment of the present invention.

Embodiments of the present invention will be explained below with reference to the attached drawings. It should be noted that the present invention is not limited to the embodiments but covers their equivalents. Throughout the attached drawings, similar or same reference numerals show similar, equivalent or same components. The drawings, however, are shown schematically for the purpose of explanation so that their components are not necessarily the same in shape or dimension as actual ones. In other words, concrete shapes or dimensions of the components should be considered as described in these specifications, not in view of the ones shown in the drawings. Further, some components shown in the drawings may be different in dimension or ratio from each other.

FIRST EMBODIMENT

A first embodiment of a scan test circuit and a method of arranging the same in accordance with the present invention will be described below with reference to the attached drawings. FIG. 1 is a block diagram of a replaced cell provided to make timing adjustments and optimization of layout design feasible. In this embodiment, a multiplexed scan flip-flop circuit is used for a scan circuit that receives an output signal from the replaced cell.

As shown in FIG. 1, replaced cell CELL1 includes clock buffer circuit CB1 and flip-flop circuit FF1. Replaced cell CELL1 is set in place of a final stage clock buffer circuit neighboring on a side of the scan circuit between the scan circuit and cascade-connected clock buffer circuits (called a clock buffer circuit section) to make a clock tree circuit. Arrangements and structures of the clock buffer circuits and the scan circuit will be explained later in detail.

Clock buffer circuit CB1 has the same structure as one of the clock buffer circuits at the final stage that has not been replaced yet, receives input clock signal CLKI, is driven by clock signal CLKI, and provides clock signal CLKO to the scan circuit and the like, such as the scan flip-flop circuit. Flip-flop circuit FF1 receives scan shift enable signal SSEI input at port D, latches scan shift enable signal SSEI at a falling-down time of clock CLKI, and supplies port Q with the latest scan shift enable signal SSEO updated and stored in flip-flop circuit FF1. Thus, output scan shift enable signal SSEO is synchronized with output clock signal CLKO.

Figure 2:
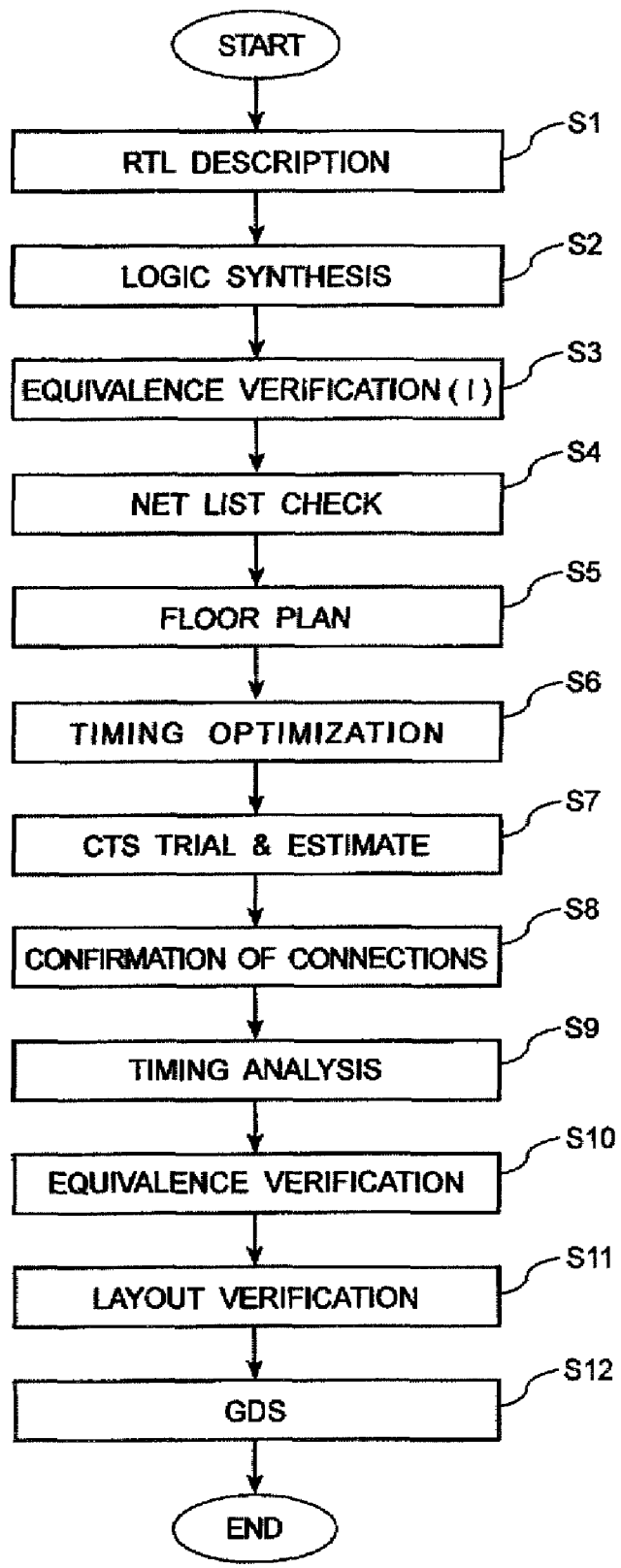
FIG. 2 is a flow chart of a method of designing a semiconductor integrated circuit as a system LSI in accordance with the first embodiment of the present invention.
Figure 3:
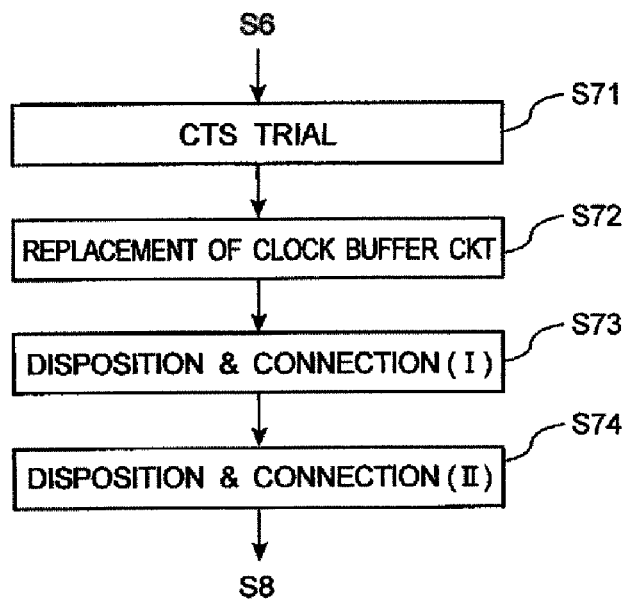
FIG. 3 is a flow chart of a method of arranging the replaced cell in accordance with the first embodiment of the present invention.

Next, a method of designing a semiconductor integrated circuit will be described below with reference to FIGS. 2 and 3. FIG. 2 is a flow chart of a method of designing a semiconductor integrated circuit as a system LSI by using an electronic design automation (EDA) tool. FIG. 3 is a flow chart of a method of arranging a replaced cell. A semiconductor integrated circuit can be designed by using various other design methods than the one shown in FIG. 2. Thus, the embodiment is not limited to the same as shown in FIG. 2.

As shown in FIG. 2, the hardware description language (HDL) is used to synthesize register transfer level (RTL) descriptions from operating descriptions close to software programs based on system designed information (step S1). The RTL descriptions are then divided in detail so that gate level logic circuits are synthesized (step S2). Subsequently, a logic simulator is used to carry out equivalence verification as to whether logic functions are correct (step S3). Connection related data (net list) of macro-cells set in the logic circuits are then checked (step S4).

Estimates are then carried out for an LSI size, power consumption, a chip area, a package size (floor plan), etc. (step S5). Each macro-cell and the like are disposed and connected in the LSI chip while operating timings are optimized (step 6).

Next, clock tree synthesis (CTS) is tested on a trial basis and is estimated (step S7). Concretely, as shown in FIG. 3, a clock tree circuit is logically generated and clock buffer circuits are then disposed and connected (step S71). The clock buffer circuit (final stage clock buffer circuit) neighboring on the side of the scan flip-flop circuit between the cascade connected clock buffer circuits and the scan flip-flop circuit is exchanged by replaced cell CELL1 shown in FIG. 1 (step S72). The clock buffer circuits and the replaced cell are then disposed and connected to each other (step S73). The replaced cell and the flip-flop circuits are also disposed and connected to each other (step 74).

Next, it is confirmed whether connections or wirings among each macro-cell, the clock buffer circuits to form the clock tree circuit, the scan flip-flop circuits, the replaced cell, etc. are proper (step S8). Analysis (step 9) as to whether timings are set in a predetermined range is executed by means of a static timing analyzer or the like. If the timings are out of the range, the steps from the floor plan (step S5) to timing analysis (step 9) are repeated all over again.

Subsequently, a logic simulator is used to carry out equivalence verification as to whether logic functions are correct (step S10). Layout verification tools of a design rule checker (DRC), a layout-versus-schematic (LVS), Ant, and the like are used to verify whether layout data are proper (step S11). Designed data are transformed into CAD layout data in the form of graphic data system (GDS) II (step S12).

Figure 4:
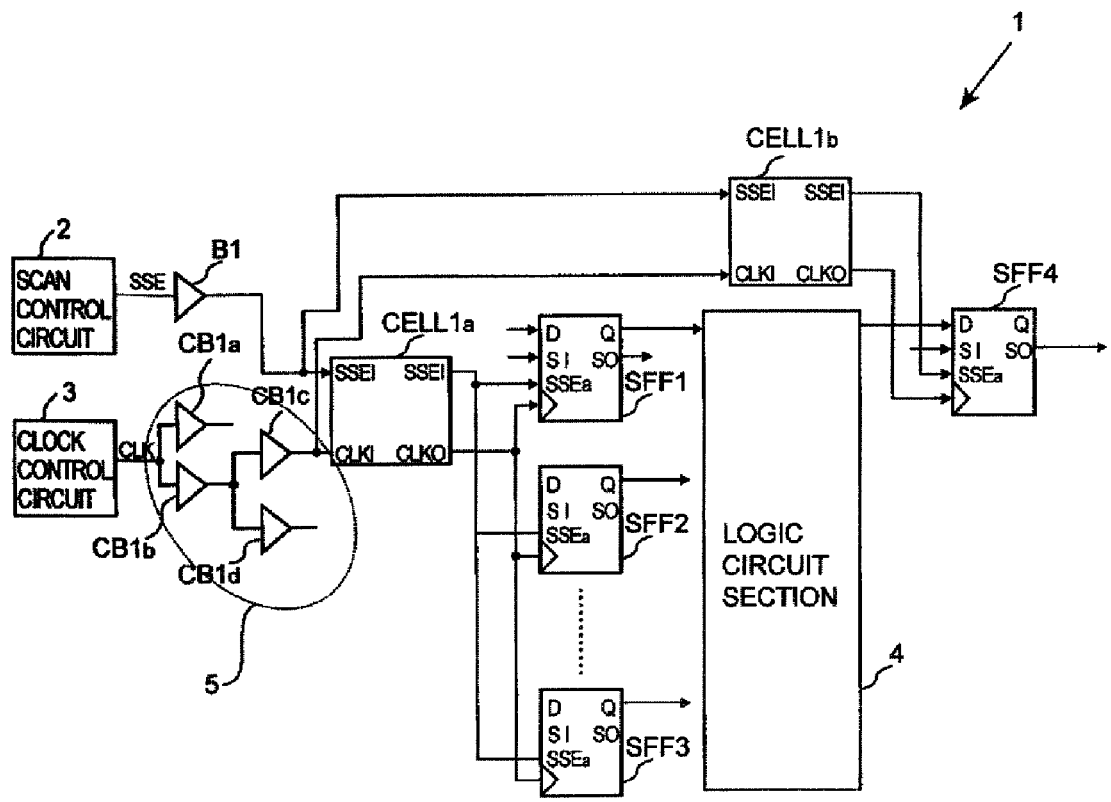
FIG. 4 is a block diagram of a semiconductor integrated circuit provided with the replaced cell in accordance with the first embodiment of the present invention.
Figure 5:
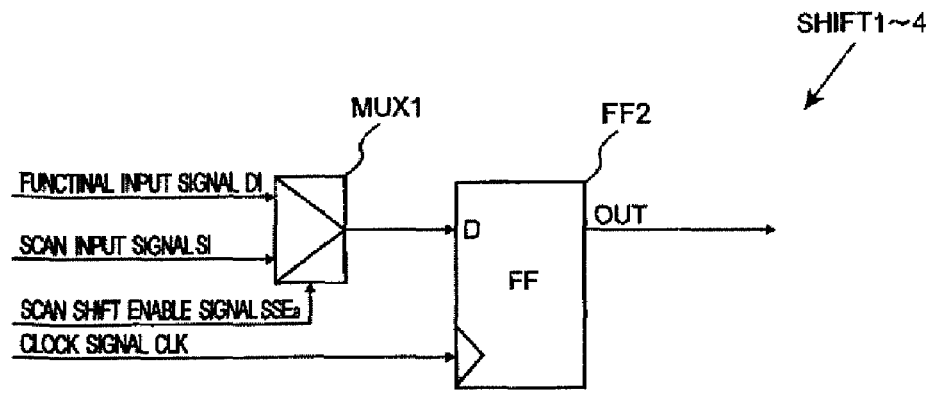
FIG. 5 is a block diagram of a scan flip-flop circuit in accordance with the first embodiment of the present invention.

Further, with reference to FIGS. 4 and 5, a semiconductor integrated circuit as a designed system LSI will be described below. FIGS. 4 and 5 are block diagrams of a semiconductor integrated circuit provided with replaced cells, and a scan flip-flop circuit, respectively. As those skilled in the semiconductor art can understand, such a semiconductor integrated circuit further includes input and output circuits and a memory not shown in FIGS. 4 and 5 and their descriptions are omitted.

Semiconductor integrated circuit 1 is provided with scan control circuit 2, clock control circuit 3, logic circuit section 4, buffer circuit B1, clock buffer circuits CB1a-CB1d, replaced cells CELL1a and CELL1b and scan flip-flop circuits SFF1-SFF4.

Scan control circuit 2 generates a scan control signal of scan shift enable signal SSE and supplies the same to buffer circuit B1. Clock control circuit 3 generates a control signal of clock signal CLK and supplies the same to clock buffer circuits CB1a and CB1b.

Buffer circuit B1 is provided between scan control circuit 2 and replaced cells CELL1a and CELL1b, drives scan shift enable signal SSE, and supplies an output signal to replaced cells CELL1a and CELL1b. A plurality of buffer circuits may be set in place of buffer circuit B1 or buffer circuit B1 may be deleted.

Clock control circuit 3 is connected to clock buffer circuits CB1a-CB1d (i.e., a clock buffer circuit section), which forms clock tree circuit 5. Clock buffer circuit CB1c is connected to replaced cells CELL1a-CELL1b. First stages of clock buffer circuits CB1a-CB1b receive clock signal CLK from clock control circuit 3. Second stages of clock buffer circuits CB1c-CB1d receive an output clock signal from clock buffer circuit CB1b. Clock buffer circuit CB1c provides an output clock signal to replaced cells CELL1a-CELL1b. The clock tree circuit is not limited to such a two-stage structure but may be changed to a three-stage structure or more to comply with requirements for semiconductor integrated circuit 1.

Replaced cell CELL1a is provided between buffer circuit B1 and scan flip-flop circuits SFF1-SFF3, receives scan shift enable signal SSE(I) from scan control circuit 2 at ports SSEI and the output clock signal from clock buffer circuit CB1c at port CLKI, and supplies an output clock signal from port CLKO and output scan shift enable signal SSE(O) synchronized with clock signal CLK (O) from port SSEO.

Replaced cell CELL1b is provided between buffer circuit B1 and clock tree circuit 5 and scan flip-flop circuit SFF4, receives scan shift enable signal SSE(I) from scan control circuit 2 at ports SSEI and output clock signal CLK(I) from clock buffer circuit CB1c at port CLKI, and supplies output clock signal CLK(O) from port CLKO and output scan shift enable signal SSE(O) synchronized with clock signal CLK (O) from port SSEO.

Scan flip-flop circuits SFF1-SFF3 are provided between replaced cell CELL1a and logic circuit section 4, receive output clock signal CLK(O) and output scan shift enable signal SSE(O) from replaced cell CELL1a at input ports and ports SSEa of each of scan flip-flop circuits SFF1-SFF3 and produce processed-output signals from ports Q and SO of each of scan flip-flop circuits SFF1-SFF3.

Logic circuit section 4 connected between scan flip-flop circuits SFF1-SFF3 and scan flip-flop circuit SFF4 includes various logic circuits required for a system LSI, cores of processors, scan registers, etc. Logic circuit section 4 receives the output signals from ports Q of scan flip-flop circuit SFF1-SFF3, executes various logic functions for a system operation at ordinary time and scan operations at scan test to produce logic function signals and scan operation signals. When a circuit size of logic circuit section 4 is so large that the exclusive application of a scan test method to the system LSI causes data volume increase and the data volume is bigger than a memory capacity of a LSI tester, it is preferable to provide the system LSI with a logic BIST function.

Scan flip-flop circuit SFF4 receives the output signal from logic circuit section 4 at port D, clock signal CLK(O) from replaced cell CELL1b and scan shift enable signal SSE(O) synchronized with clock CLK(O) from replaced cell CELL1b at port SSEa, and produces the processed output signals from port Q or SO.

Here, since the scan shift enable signals are distributed to the loads, a suitable distribution of loads can be carried out independently of a place or a configuration of the clock tree circuit in the case where the replaced cell is set in place of the final stage of the clock tree circuit in comparison with the case where flip-flop circuits are inserted to carry out a synchronizing method.

As shown in FIG. 5, each of scan flip-flop circuits SFF1-SFF4 functioning as a scan circuit is a multiplexed scan flip-flop circuit that is composed of multiplexer MUX1 and flip-flop circuit FF2 and that is controlled by multiplexer MUX1.

Multiplexer MUX1 receives functional input signal DI and scan input signal SI, selects data DI or scan input signal SI in response to levels of scan shift enable signal SSEa and supplies an output signal to flip-flop circuit FF2.

Flip-flop circuit FF2 receives the output signal from multiplexer MUX1 at port D and latches the same at its rising-up time, stores the latched signal, updates it with the latest signal, and produces output signal OUT.

Thus, when multiplexer MUX1 selects functional input signal DI, flip-flop circuit FF2 stores data, updates the same with the latest data, and produces a functional signal as output signal OUT. When multiplexer MUX1 selects scan input signal SI, however, flip-flop circuit FF2 stores data, updates the same with the latest data, and produces a scan output signal as output signal OUT.

A scan operation will now be explained with reference to a timing chart shown in FIG. 6. The chart indicates a scan test to detect a delay fault of the logic circuit section in the case where scan flip-flop circuit SFF1 and SFF4 are selected as a launch flip-flop circuit and a capture flip-flop circuit, respectively.

Figure 6:
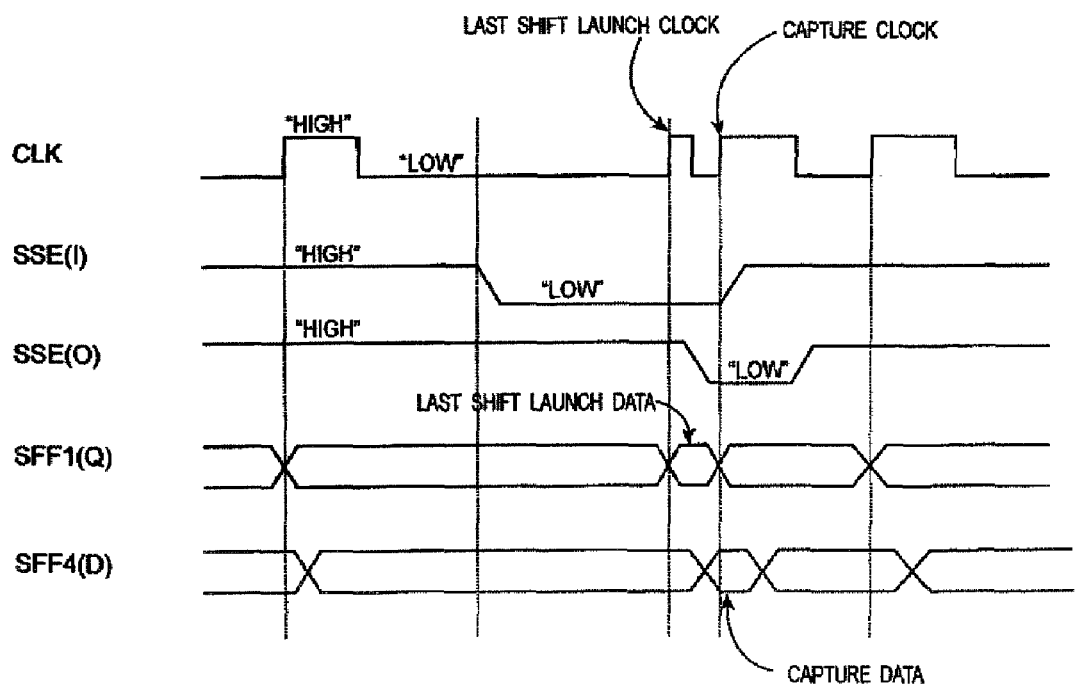
FIG. 6 is a timing chart of a scan operation in accordance with the first embodiment of the present invention.

As shown in FIG. 6, scan enable signal SSE(I) input to port SSEI of replaced cell CELL1a shits from a "High" level to a "Low" level during one cycle before a last shift launch clock. Scan shift enable signal SSE(O) output from port SSEO of replaced cell CELL1a maintains a "High" level for a period of time until the last shift launch clock falls down. Since scan shift enable signals SSE(O) output from port SSEO of replaced cell CELL1a and CELL1b are supplied to ports SSEa of scan flip-flop circuits SFF1-SFF3 and scan flip-flop circuit SFF4 during such a period of time, respectively, ports SSEa of scan flip-flop circuits SFF1 and SFF4 are in a "High" level scan shift state.

When the last shift launch clock is input, scan shift enable signal SSE(O) supplied from port SSEO of replaced cell CELL1a is shifted to a "Low" level at a rising-up time of the last shift launch clock. At this time, ports SSEa of scan flip-flop circuits SFF1-SFF4 to which scan shift enable signal SSE(O) is supplied from port SSEO of replaced cell CELL1a becomes a "Low" level.

In the scan test to detect a delay fault of the logic circuit section, when the last shift launch clock is supplied to scan flip-flop circuit SFF1 and scan shift enable signal SSE(O) output from port SSEO of replaced cell CELL1a is a "High" level, scan flip-flop circuit SFF1 outputs last shift data SFF1 (Q) as launch data from port Q. Here, the launch data are scan-in data used for the scan test.

Next, logic circuit section 4 receives the last shift launch data output from scan flip-flop circuit SFF1 so that scan registers provided in logic circuit section 4 carry out the scan test in response to the last shift launch data. Scan flip-flop circuit SFF4 is then selected in response to scan shift enable signal SSE(O) output from port SSEO of replaced cell CELL1b that has been shifted to a "Low" level before a capture clock signal arrives. Thus, scan flip-flop circuit SFF4 receives scan test information of capture data SFF4(D) supplied from logic circuit section 4 to port D and provides an output from port SO of scan flip-flop circuit SFF4.

As set forth above, the scan test circuit of the semiconductor integrated circuit in accordance with the embodiment and the method of arranging the same include the clock buffer circuits cascade-connected to form clock tree circuit 5 and replaced cells CELL1a and CELL1b set in place of the last stage clock buffer circuit neighboring the scan circuit side between clock tree circuit 5 and the scan circuit. Clock signal CLK(O) output from clock buffer circuit CB1 is synchronized with scan shift enable signal SSE(O) output from flip-flop circuit FF1.

Thus, when scan shift signal SSE is provided through pipeline architecture, scan shift enable signal SSE is distributed to loads, so that troublesome operations are not required, the degree of freedom for layout design is improved and optimization of timing adjustment and layout design can be easily achieved in comparison with a conventional method of inserting flip-flop circuits and the like for synchronization. The scan test circuit of the invention fulfils high-speed operations and optimum timing adjustments for a large circuit size system LSI or SoC device.

Further, although the scan test is carried out the clock signal output from clock control circuit 3, a system clock that is generated by phase-locked-loop circuits in semiconductor integrated circuit 1 and that is faster than the clock signal can also be additionally used. The clock signal is used for writing data in the scan test circuit or reading data from the same while the high-speed system clock is used for the detection of a delay fault of the logic circuit section. In this case, a selector and the like are used for the selection of the clock signal or the system clock signal.

SECOND EMBODIMENT

Figure 7:
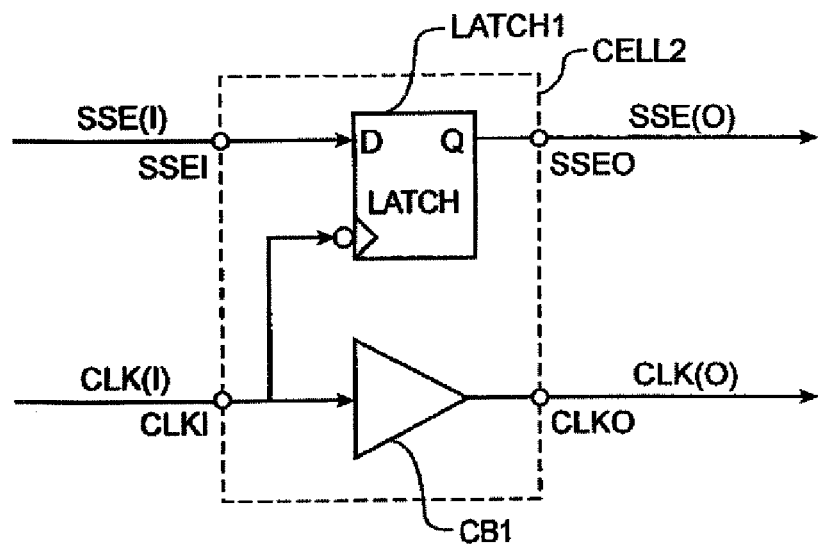
FIG. 7 is a block diagram of a replaced cell in accordance with a second embodiment of the present invention.

Next, a scan test circuit in accordance with a second embodiment of the present invention will be described with reference to the attached drawings. FIG. 7 is a block diagram of a replaced cell. A latch circuit is used for a replaced cell in this embodiment.

Identical reference symbols for components of the second embodiment indicate the same ones as those of the first embodiment so that different components will be primarily described below.

As shown in FIG. 7, replaced cell CELL2 includes clock buffer circuit CB1 and latch circuit LATCH1. Replaced cell CELL2 is provided to replace the last clock buffer circuit neighboring the scan circuit side between the scan circuit and the clock buffer circuits cascade-connected to form the clock tree circuit.

Latch circuit LATCH1 is simpler in structure than a master-slave type flip-flop circuit, for example. Latch circuit LATCH1 receives scan shift enable signal SSE(I) at port D as a scan control signal used for a scan test method, latches scan shift enable signal SSE(I) at a rising-up time of clock signal CLK(I), and outputs the latest scan enable signal SSE(O) stored and updated from port Q to the scan circuit. Thus, output clock signal CLK(O) is synchronized with output scan enable signal SSE(O).

As set forth above, the scan test circuit in accordance with the second embodiment includes the clock buffer circuits cascade-connected to form clock tree circuit 5 and replaced cell CELL2 composed of clock buffer circuit CB1 and latch circuit LATCH1 to replace the final stage buffer circuit neighboring on the scan circuit side between clock tree circuit 5 and the scan circuit. Clock signal CLK(O) output from clock buffer circuit CB1 is synchronized with scan shift enable signal SSE(O) output from latch circuit LATCH1.

Thus, when scan shift signal SSE is provided through pipeline architecture, scan shift enable signal SSE is distributed to loads, so that troublesome operations are not required, the degree of freedom for layout design is improved and optimization of timing adjustment and layout design can be easily achieved in comparison with a conventional method of inserting flip-flop circuits and the like for synchronization. The replaced cell circuit of the second embodiment is more simplified than that of the first embodiment to suppress increase of a system LSI size.

THIRD EMBODIMENT

Figure 8:
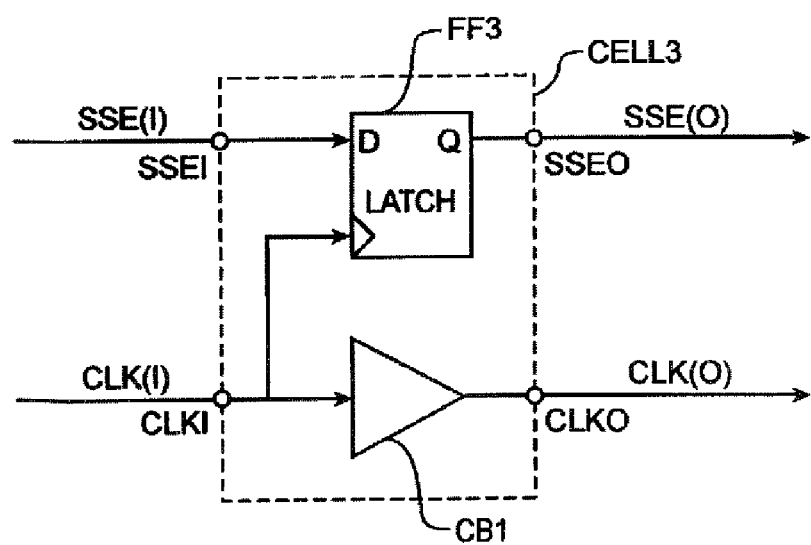
FIG. 8 is a block diagram of a replaced cell in accordance with a third embodiment of the present invention.

Next, a scan test circuit in accordance with a third embodiment of the present invention will be described with reference to the attached drawings. FIG. 8 is a block diagram of a replaced cell. A flip-flop circuit is used for a replaced cell in this embodiment.

Identical reference symbols for components of the third embodiment indicate the same ones as those of the first embodiment, so that different components will be primarily described below.

As shown in FIG. 8, replaced cell CELL3 includes clock buffer circuit CB1 and flip-flop circuit FF3. Replaced cell CELL3 is provided to replace the last clock buffer circuit neighboring the scan circuit side between the scan circuit and the clock buffer circuits cascade-connected to form the clock tree circuit.

Flip-flop circuit FF3 receives scan shift enable signal SSE(I) at port D as a scan control signal used for a scan test method, latches scan shift enable signal SSE(I) at a rising-up time of clock signal CLK(I), and outputs the latest scan enable signal SSE(O) stored and updated from port Q to the scan circuit. Thus, output clock signal CLK(O) is synchronized with output scan enable signal SSE(O).

As set forth above, the scan test circuit in accordance with the third embodiment includes the clock buffer circuits cascade-connected to form clock tree circuit 5 and replaced cell CELL3 composed of clock buffer circuit CB1 and flip-flop circuit FF3 to replace the final stage buffer circuit neighboring on the scan circuit side between clock tree circuit 5 and the scan circuit. Clock signal CLK(O) output from clock buffer circuit CB1 is synchronized with scan shift enable signal SSE(O) output from flip-flop circuit FF3.

Thus, when scan shift signal SSE is provided through pipeline architecture, scan shift enable signal SSE is distributed to loads, so that troublesome operations are not required, the degree of freedom for layout design is improved and optimization of timing adjustment and layout design can be easily achieved in comparison with a conventional method of inserting flip-flop circuits and the like for synchronization.

The present invention is not limited to the embodiments described above, but various variations and modification may be made without departing from the scope of the present invention.

In the foregoing description, certain terms have been used for brevity, clearness and understanding, but no unnecessary limitations are to be implied therefrom beyond the requirements of the prior art, because such words are used for descriptive purposes herein and are intended to be broadly construed. Moreover, the embodiments of the improved construction illustrated and described herein are by way of example, and the scope of the invention is not limited to the exact details of construction. Having now described the invention, the construction, the operation and use of embodiments thereof, and the advantageous new and useful results obtained thereby, the new and useful construction, and reasonable equivalents thereof obvious to those skilled in the art, are set forth in the appended claims.

What is claimed is:

1. A scan test circuit, comprising:
   a clock control circuit generating a clock signal;
   a scan control circuit generating a scan shift enable signal;
   a clock buffer circuit section having clock buffer circuits cascade-connected to form a clock tree circuit to drive the clock signal;
   a replaced cell provided to replace one of the clock buffer circuits in the clock tree circuit, the replaced cell receiving the scan shift enable signal output from the scan control circuit and the clock signal output from the clock buffer circuit section and outputting a first clock signal and a first scan shift enable signal synchronized with the first clock signal; and
   a scan circuit receiving the first scan shift enable signal synchronized with the first clock signal output from the replaced cell, the first clock signal, a data signal, and a scan input signal, and outputting a scan test signal,
   wherein the replaced cell includes a clock buffer circuit driving the clock signal from the first clock control circuit and outputting the first clock signal to the scan circuit, and a flip-flop circuit receiving the scan shift enable signal and the clock signal from the clock control circuit, latching the scan shift enable signal to store and to update in the flip-flop circuit, and providing the scan circuit with the first scan shift enable signal.

2. A scan test circuit according to claim 1, wherein the replaced cell is set in place of one of the clock buffer circuits at a last stage of the clock tree circuit.

3. A scan test circuit according to claim 1, wherein the flip-flop circuit latches the scan shift enable signal from the scan control circuit at a falling-down or rising-up time of the clock signal from the clock control circuit.

4. A scan test circuit, comprising:
   a clock control circuit generating a clock signal;
   a scan control circuit generating a scan shift enable signal;
   a clock buffer circuit section having clock buffer circuits cascade-connected to form a clock tree circuit to drive the clock signal;

a replaced cell provided to replace one of the clock buffer circuits in the clock tree circuit, the replaced cell receiving the scan shift enable signal output from the scan control circuit and the clock signal output from the clock buffer circuit section and outputting a first clock signal and a first scan shift enable signal synchronized with the first clock signal; and a scan circuit receiving the first scan shift enable signal synchronized with the first clock signal output from the replaced cell, the first clock signal, a data signal and a scan input signal and outputting a scan test signal, wherein the replaced cell includes a clock buffer circuit driving the clock signal from the clock control circuit and outputting a clock signal to the scan circuit, and a latch circuit receiving the scan shift enable signal and the clock signal from the clock control circuit, latching the scan shift enable signal to store and to update in the latch circuit, and providing the scan circuit with the first scan shift enable signal.

5. A scan test circuit according to claim 4, wherein the replaced cell is set in place of one of the clock buffer circuits at a last stage of the clock tree.

6. A scan test circuit according to claim 4, wherein the latch circuit latches the scan shift enable signal from the scan control circuit at a falling-down time of the clock signal from the clock control circuit.

7. A scan test circuit, comprising:
a clock control circuit generating a clock signal;
a scan control circuit generating a scan shift enable signal;
a clock buffer circuit section having clock buffer circuits cascade-connected to form a clock tree circuit to drive the clock signal;
a first replaced cell provided to replace one of the clock buffer circuits in the clock tree circuit, the first replaced cell receiving the scan shift enable signal output from the scan control circuit and the clock signal output from the clock buffer circuit section and outputting a first clock signal and a first scan shift enable signal synchronized with the first clock signal;
a second replaced cell provided to replace one of the clock buffer circuits in the clock tree circuit, the second replaced cell receiving the scan shift enable signal output from the scan control circuit and the clock signal output from the clock buffer circuit section and outputting a second clock signal and a second scan shift enable signal synchronized with the second clock signal;
a first scan circuit receiving the first scan shift enable signal synchronized with the first clock signal output from the first replaced cell, the first clock signal, a functional input signal as a data signal, and a scan input signal to output a first scan test signal;
a logic circuit section receiving the first scan test signal from the first scan circuit and carrying out a scan test based on the scan input signal; and
a second scan circuit receiving the second scan shift enable signal synchronized with the second clock signal from the second replaced cell, the second clock signal from the second replaced cell, the scan input signal, and scan test information from the logic circuit section as a data signal to output the scan test information,
wherein the first replaced cells includes a first clock buffer circuit driving the clock signal from the clock control circuit and outputting a first clock signal to the first scan circuit, and a first flip-flop circuit receiving the scan shift enable signal as a data signal, receiving the clock signal from the clock control circuit, latching the scan shift enable signal to store and update in the first flip-flop circuit, and providing the first scan circuit with the first scan shift enable signal, and wherein the second replaced cells includes a second clock buffer circuit driving the clock signal from the clock control circuit and outputting a second clock signal to the second scan circuit, and a second flip-flop circuit receiving the scan shift enable signal as a data signal, receiving the clock signal from the clock control circuit, latching the scan shift enable signal to store and update in the second flip-flop circuit, and providing the second scan circuit with the second scan shift enable signal.

8. A scan test circuit according to claim 7, wherein the first and the second replaced cell are set in place of ones of the clock buffer circuits at a last stage of the clock tree circuit.

9. A scan test circuit according to claim 7, wherein the first and the second flip-flop circuits latch the scan shift enable signal from the scan control circuit at a falling-down time of the clock signal from the clock control circuit.

10. A scan test circuit according to claim 7,
wherein the first scan circuit is provided with a first multiplexer and a third flip-flop circuit, the first multiplexer receiving the first scan shift enable signal, the functional input signal and the scan input signal to select one of the first scan shift enable signal and the functional input signal and to output to the third flip-flop circuit as a data signal, the third flip-flop circuit receiving the first clock signal and outputting a data signal to the logic circuit section, and
wherein the second scan circuit is provided with a second multiplexer and a fourth flip-flop circuit, the second multiplexer receiving the second scan shift enable signal, the scan test information and the scan input signal to select one of the second scan shift enable signal and the scan test information to output to the fourth flip-flop circuit as a data signal, the fourth flip-flop circuit receiving the second clock signal and outputting the scan test information.

11. A scan test circuit, comprising:
a clock control circuit generating a clock signal;
a scan control circuit generating a scan shift enable signal;
a clock buffer circuit section having clock buffer circuits cascade-connected to form a clock tree circuit to drive the clock signal;
a first replaced cell provided to replace one of the clock buffer circuits in the clock tree circuit, the first replaced cell receiving the scan shift enable signal output from the scan control circuit and the clock signal output from the clock buffer circuit section and outputting a first clock signal and a first scan shift enable signal synchronized with the first clock signal;
a second replaced cell provided to replace one of the clock buffer circuits in the clock tree circuit, the second replaced cell receiving the scan shift enable signal output from the scan control circuit and the clock signal output from the clock buffer circuit section and outputting a second clock signal and a second scan shift enable signal synchronized with the second clock signal;
a first scan circuit receiving the first scan shift enable signal synchronized with the first clock signal output from the first replaced cell, the first clock signal and a scan input signal to output a first scan test signal;
a logic circuit section receiving the first scan test signal from the first scan circuit and carrying out a scan test based on the scan input signal; and a second scan circuit receiving the second scan shift enable signal synchronized with the second clock signal from the second replaced cell, the second clock signal from the second replaced cell, scan test information from the logic circuit section to output the scan test information, wherein the first replaced cell includes a first clock buffer circuit driving the clock signal from the clock control circuit and outputting a clock signal to the first scan circuit, and a first latch circuit receiving the scan shift enable signal as a data signal, receiving the clock signal from the clock control circuit, latching the scan shift enable signal to store and update in the latch circuit, and providing the first scan circuit with the first scan shift enable signal, and wherein the second replaced cell includes a second clock buffer circuit driving the clock signal from the clock control circuit and outputting a clock signal to the second scan circuit, and a second latch circuit receiving the scan shift enable signal as a data signal, receiving the clock signal from the clock control circuit, latching the scan shift enable signal to store and update in the latch circuit, and providing the second scan circuit with the second scan shift enable signal.

12. A scan test circuit according to claim 11, wherein the first and the second replaced cell are set in place of one of the clock buffer circuits at a last stage of the clock tree circuit.

13. A scan test circuit according to claim 11, wherein the first and the second latch circuits latch the scan shift enable signal from the scan control circuit at a falling-down time of the clock signal from the clock control circuit.

14. A scan test circuit according to claim 11, wherein the first scan circuit is provided with a first multiplexer and a third flip-flop circuit, the first multiplexer receiving the first scan shift enable signal, the functional input signal and the scan input signal to select one of the first scan shift enable signal and the functional input signal and to output to the third flip-flop circuit as a data signal, the third flip-flop circuit receiving the first clock signal and outputting a data signal to the logic circuit section, and wherein the second scan circuit is provided with a second multiplexer and a fourth flip-flop circuit, the second multiplexer receiving the second scan shift enable signal, the scan test information and the scan input signal to select one of the second scan shift enable signal and the scan test information to output to the fourth flip-flop circuit as a data signal, the fourth flip-flop circuit receiving the second clock signal and outputting the scan test information.

* * * * *